United States Patent
Lin et al.

(10) Patent No.: US 9,208,854 B2
(45) Date of Patent: *Dec. 8, 2015

(54) THREE DIMENSIONAL DUAL-PORT BIT CELL AND METHOD OF ASSEMBLING SAME

(71) Applicant: Taiwan Semiconductor Manufacturing Co., Ltd., Hsin-Chu (TW)

(72) Inventors: Tzu-Kuei Lin, Chu-Pai (TW);
Hung-Jen Liao, Hsin-Chu (TW);
Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 55 days.

This patent is subject to a terminal disclaimer.

(21) Appl. No.: 14/098,567

(22) Filed: Dec. 6, 2013

(65) Prior Publication Data

US 2015/0162074 A1 Jun. 11, 2015

(51) Int. Cl.

| | | |
|---|---|---|
| *G11C 11/00* | (2006.01) | |
| *G11C 11/413* | (2006.01) | |
| *H01L 27/11* | (2006.01) | |
| *G11C 7/10* | (2006.01) | |
| *H01L 25/065* | (2006.01) | |
| *G11C 11/40* | (2006.01) | |

(52) U.S. Cl.
CPC ............ *G11C 11/413* (2013.01); *G11C 7/1075* (2013.01); *H01L 27/11* (2013.01); *G11C 7/1096* (2013.01); *G11C 11/40* (2013.01); *H01L 25/0657* (2013.01)

(58) Field of Classification Search
CPC .............. H01L 25/0657; H01L 27/105; H01L 27/1104; G06F 11/0745; G06F 17/5072; G11C 8/16; G11C 11/40; G11C 11/419; G11C 5/02; G11C 7/1096
USPC ............. 365/51, 63, 129, 154, 156, 174, 188, 365/189.011, 189.14, 189.17, 189.05
See application file for complete search history.

(56) References Cited

U.S. PATENT DOCUMENTS

| | | | | |
|---|---|---|---|---|
| 2007/0115710 | A1* | 5/2007 | Kim et al. | 365/63 |
| 2008/0123462 | A1* | 5/2008 | Liaw | 365/230.05 |
| 2008/0283995 | A1* | 11/2008 | Bucki et al. | 257/690 |
| 2008/0291767 | A1* | 11/2008 | Barnes et al. | 365/230.05 |
| 2009/0303820 | A1 | 12/2009 | Arsovski | |
| 2015/0063040 | A1* | 3/2015 | Chan et al. | 365/189.04 |
| 2015/0085556 | A1* | 3/2015 | Chan et al. | 365/72 |
| 2015/0085567 | A1* | 3/2015 | Wang et al. | 365/156 |

* cited by examiner

*Primary Examiner* — Fernando Hidalgo
(74) *Attorney, Agent, or Firm* — Duane Morris LLP

(57) ABSTRACT

A three dimensional dual-port bit cell generally comprises a first portion of a latch disposed on a first tier, wherein the first portion includes a plurality of first port elements. A second portion of the latch is disposed on a second tier that is vertically stacked with respect to the first tier using at least one via, wherein the second portion includes a plurality of second port elements.

18 Claims, 5 Drawing Sheets

US 9,208,854 B2

THREE DIMENSIONAL DUAL-PORT BIT CELL AND METHOD OF ASSEMBLING SAME

FIELD OF DISCLOSURE

The disclosed systems and methods relate to static random access memory ("SRAM") arrays and, more particularly, to a dual-port bit cell that can be used with SRAM arrays.

BACKGROUND

Static random access memories ("SRAMs") or semi-conductor memories include a plurality of cells disposed in rows and columns to form an array. SRAM cells include a plurality of transistors coupled to bit lines and word lines that are used to read and write a bit of data to the memory cell. Single-port SRAMs enable a single bit of data to be written to or read from a bit cell at a particular time. In contrast, a dual-port SRAMs enables multiple reads or writes to occur at approximately the same time. Conventional dual-port SRAM structures include word lines ("WLs") in different metal lines, which causes different capacitive loading due to the different metal length being used to route signals of the SRAM. Dual-port SRAM structures are larger and wider in the WL direction than a single-port SRAM structure. Due to the larger and wider WL direction for the dual-port SRAM, the aspect ratio of an SRAM array can be impacted during heavy WL loading, especially for wide input/output ("I/O") designs. When compared with a single-port SRAM, the periphery logic circuitry of the dual-port SRAM is doubled. As such, dual-port SRAMs can occupy a larger area, and signal routing complexities can occur.

DETAILED DESCRIPTION

This description of the exemplary embodiments is intended to be read in connection with the accompanying drawings, which are to be considered part of the entire written description.

Some embodiments of the three dimensional dual-port bit cell described herein have a configuration and design that facilitates a reduction in footprint area, while improving overall cell performance and inhibiting signal routing complexities for the corresponding semi-conductor memory or static random access memory ("SRAM") array in which the cell is used. For example, in some embodiments, the three-dimensional dual-port cell is configured such that one set of port elements of a portion of a latch are disposed on one layer of a three-dimensional ("3D") semi-conductor integrated circuit ("IC") and another set of port elements of another portion of the latch are disposed on a different layer of the IC that is vertically adjacent to the other layer. Having the two different sets of port elements on separate layers of the IC facilitates a footprint area reduction, and word line ("WL") parasitic resistance and capacitance is also reduced. Therefore, the overall performance of the cell is substantially improved.

Figure 1:
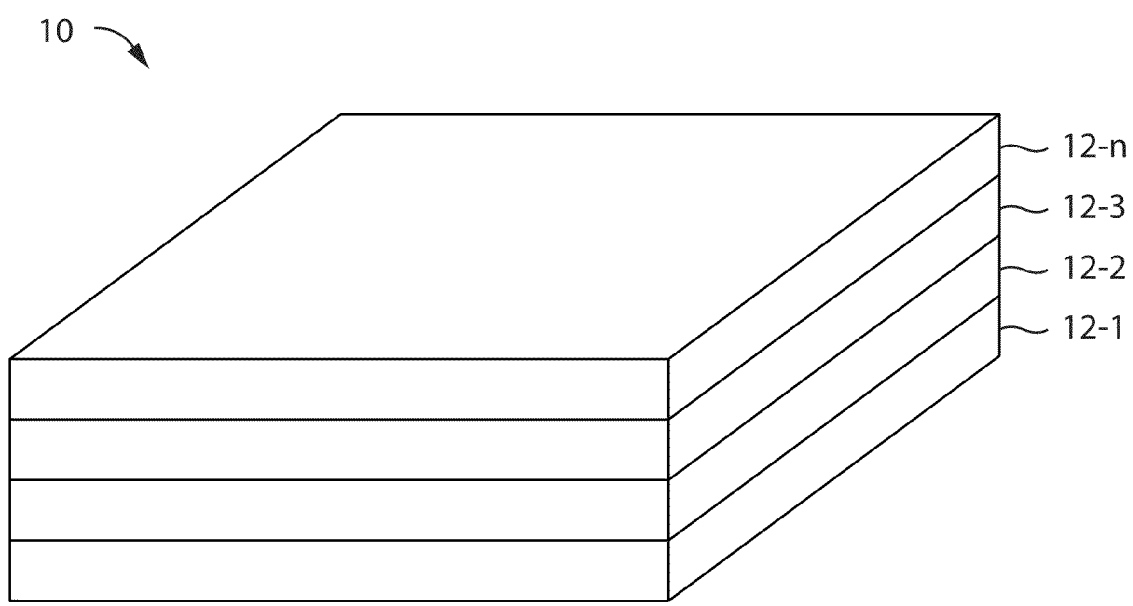
FIG. 1 is a perspective view of one example of a three-dimensional semiconductor integrated circuit in accordance with some embodiments.

FIG. 1 illustrates one example of a 3D semiconductor IC 10. 3D IC 10 includes a plurality of layers 12-1, 12-2, 12-3, 12-n ("layers 12") that are vertically stacked on top of one another in the z-direction. In some embodiments, layers 12 are individual dies that are electrically coupled to one another with at least one through-substrate via ("TSV"), or inter-layer via ("ILV") or inter-device via ("ILD") (not shown in FIG. 1). It should be noted that, as used herein, the term "couple" is not limited to a direct mechanical, thermal, communication, and/or an electrical connection between components, but may also include an indirect mechanical, thermal, communication and/or electrical connection between multiple components.

In some embodiments, each layer 12 of 3D IC 10 is a respective "tier" where each tier includes a respective active device layer and a respective interconnect structure, which can include a plurality of conductive layers (e.g., M1, M2, etc.). Interlayer dielectric ("ILD") layers (not shown) can be disposed between directly adjacent tiers as will be understood by one of ordinary skill in the art.

Figure 2:
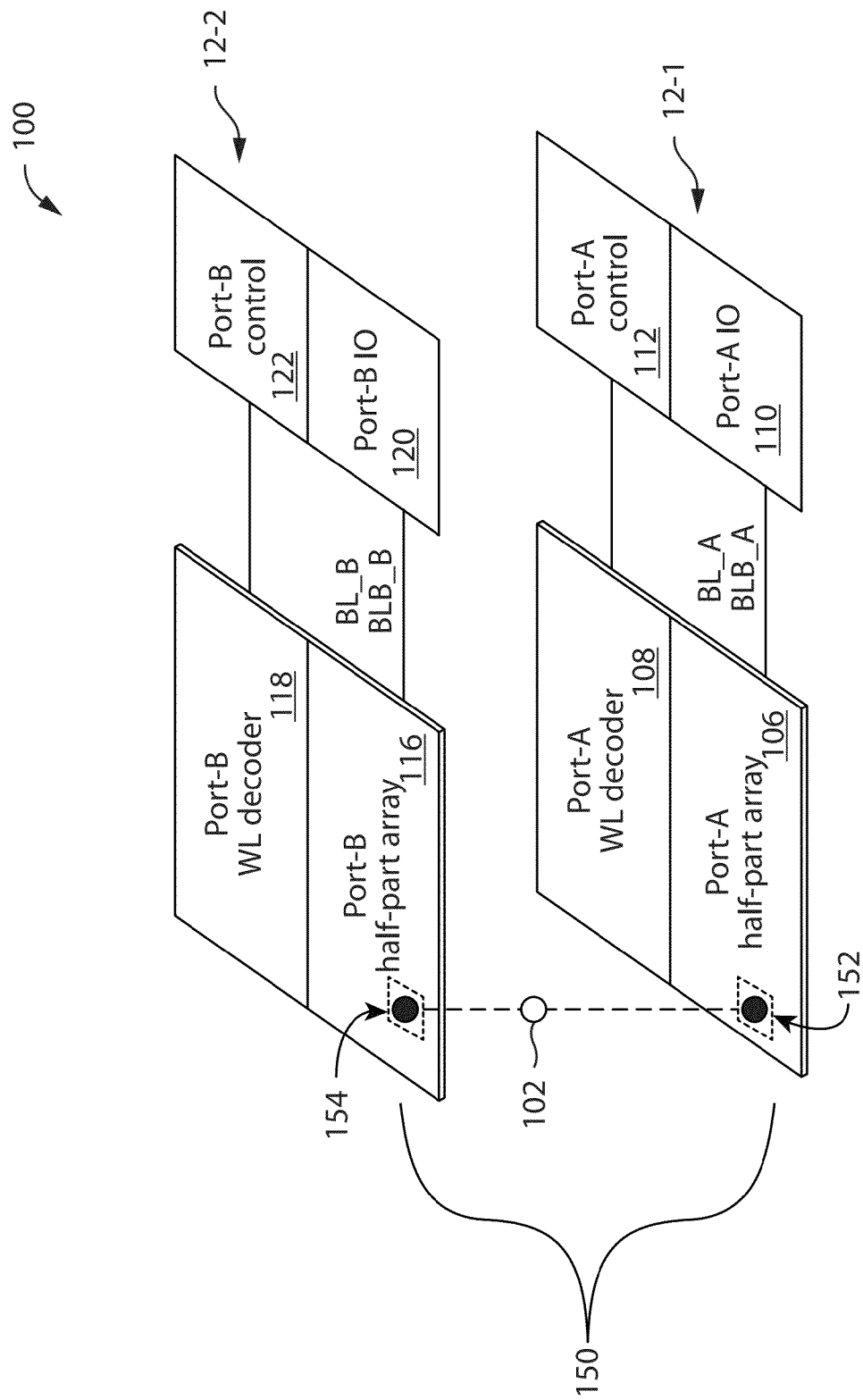
FIG. 2 is an electrical diagram of one example of a three-dimensional static random access memory (SRAM) array that is used with the three-dimensional semiconductor integrated circuit shown in FIG. 1 in accordance with some embodiments.

FIG. 2 illustrates one example of a semi-conductor memory or SRAM array 100. In some embodiments, the SRAM array 100 is included in 3D IC 10 (shown in FIG. 1). For example, SRAM array 100 can be disposed across two layers or tiers, such as bottom layer 12-1 and upper layer 12-2, that are arranged vertically with respect to one another and coupled together by, for example, one or more ILVs 102 (only one being shown in FIG. 2).

In some embodiments, bottom layer 12-1 includes one port, such as an A-port, and upper layer 12-2 includes another port, such as a B-port. As such, in some embodiments, the input/output ("I/O") circuitry for the A-port and the B-port are disposed on two separate conductive layers. For example, in some embodiments, bottom layer 12-1 includes A-port elements, such as an A-port array portion 106 and an A-port world line ("WL") decoder and driver portion 108. In some embodiments, A-port array portion 106 is coupled to an A-port I/O circuit 110 with complementary bit lines ("BLs") therebetween, such as BL_A and its complement BLB_A. In some embodiments, A-port I/O circuit 110 is configured to receive data input signals and to transmit data output signals out of SRAM 100.

As used herein, the term "circuit" refers generally to any programmable system including systems and microcontrollers, reduced instruction set circuits ("RISC"), application specific integrated circuits ("ASIC"), programmable logic circuits ("PLC"), and any other circuit capable of executing the functions described herein. The above examples are exemplary only, and thus are not intended to limit in any way the definition and/or meaning of the term "circuit."

In some embodiments, A-port WL decoder and driver portion 108 is coupled to an A-port control circuit 112. A-port control circuit 112 can be configured to receive a clock signal of the A-port and a write enable signal (negative enable). A-port control circuit 112 can also be configured to receive address signals.

Top layer 12-2 includes a B-port array portion 116 and a B-port WL decoder and driver portion 118. In some embodiments, B-port array portion 116 is coupled to a B-port I/O circuit 120 with complementary BLs therebetween, such as BL_B and its complement BLB_B. In some embodiments, B-port I/O circuit 120 is configured to receive data input signals and to transmit data output signals out of array 100. In some embodiments, B-port WL decoder and driver portion 118 is coupled to a B-port control circuit 122 that can be configured to receive a clock signal of the B-port and a write enable signal (negative enable). B-port control circuit 122 can also be configured to receive address signals.

SRAM array 100 includes at least one three-dimension dual-port bit cell 150 that includes a first portion 152 that is disposed on a first layer, e.g., bottom layer 12-1. For example, first portion 152 is disposed on at least a portion of A-port array portion 106. Dual-port bit cell 150 also includes a second portion 154 that is disposed on a second layer that is disposed vertically relative to the first layer, e.g., upper layer 12-2 of SRAM array 100. For example, second portion 154 is included in at least a portion of B-port array portion 116. As will be explained in more detail below with respect to FIGS. 3 and 4, dual-port bit cell 150 has a configuration and design that facilitates a reduction in footprint area while improving overall cell performance and inhibiting signal routing complexities for SRAM array 100.

In some embodiments, A-port array portion 106 and A-port WL decoder and driver portion 108 are disposed on bottom layer 12-1 such that A-port array portion 106 and A-port WL decoder and driver portion 108 are each symmetric with B-port array portion 116 and B-port WL decoder and driver portion 118, respectively. Similarly A-port I/O circuit 110 and A-port control circuit 112 are disposed on bottom layer 12-1 such that A-port I/O circuit 110 and A-port control circuit 112 are each symmetric with B-port I/O circuit 120 and B-port control circuit 122, respectively.

Figure 3:
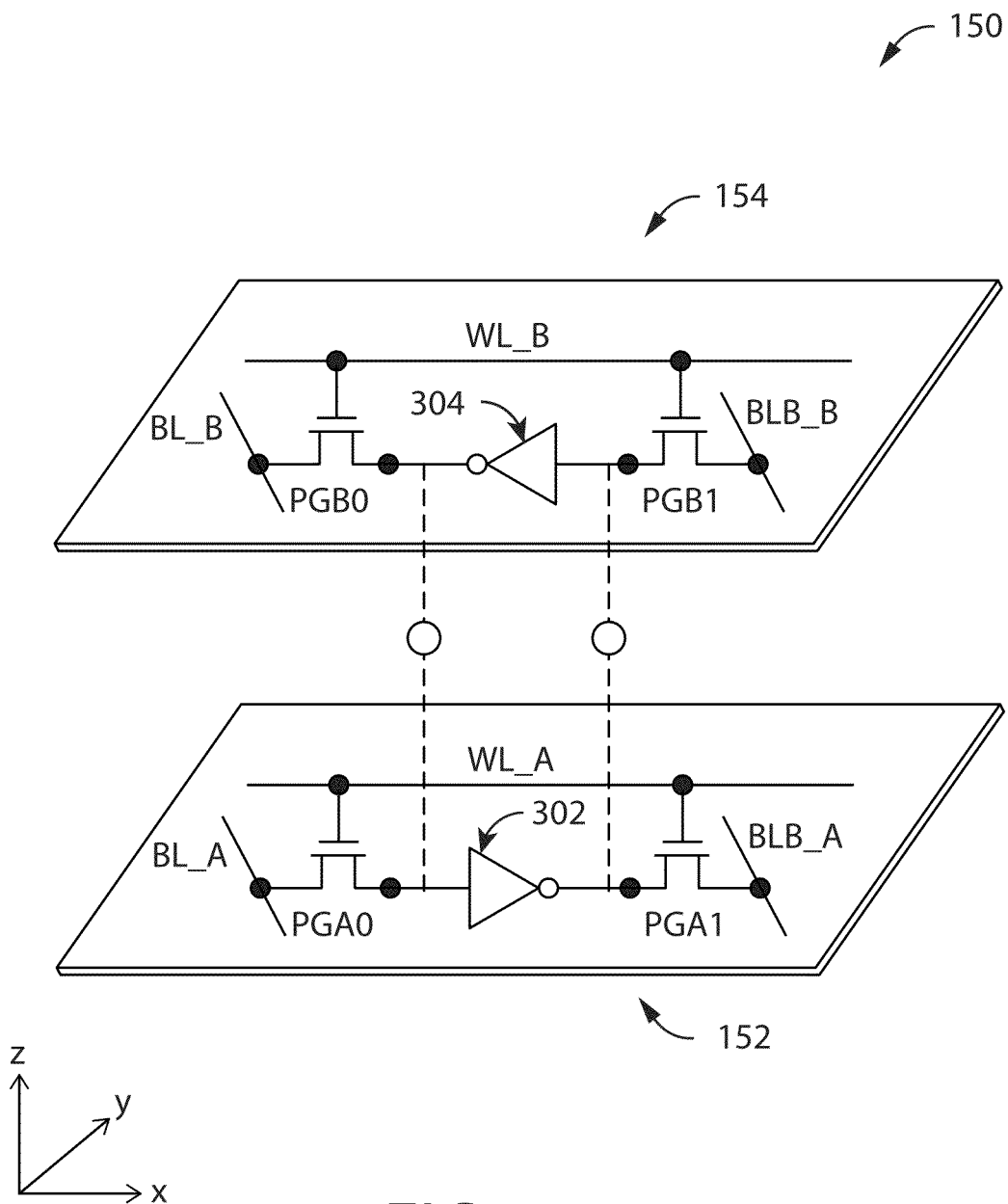
FIG. 3 is an electrical diagram of one example of a three dimensional dual-port bit cell that is used with the SRAM array shown in FIG. 2 in accordance with some embodiments.
Figure 4:
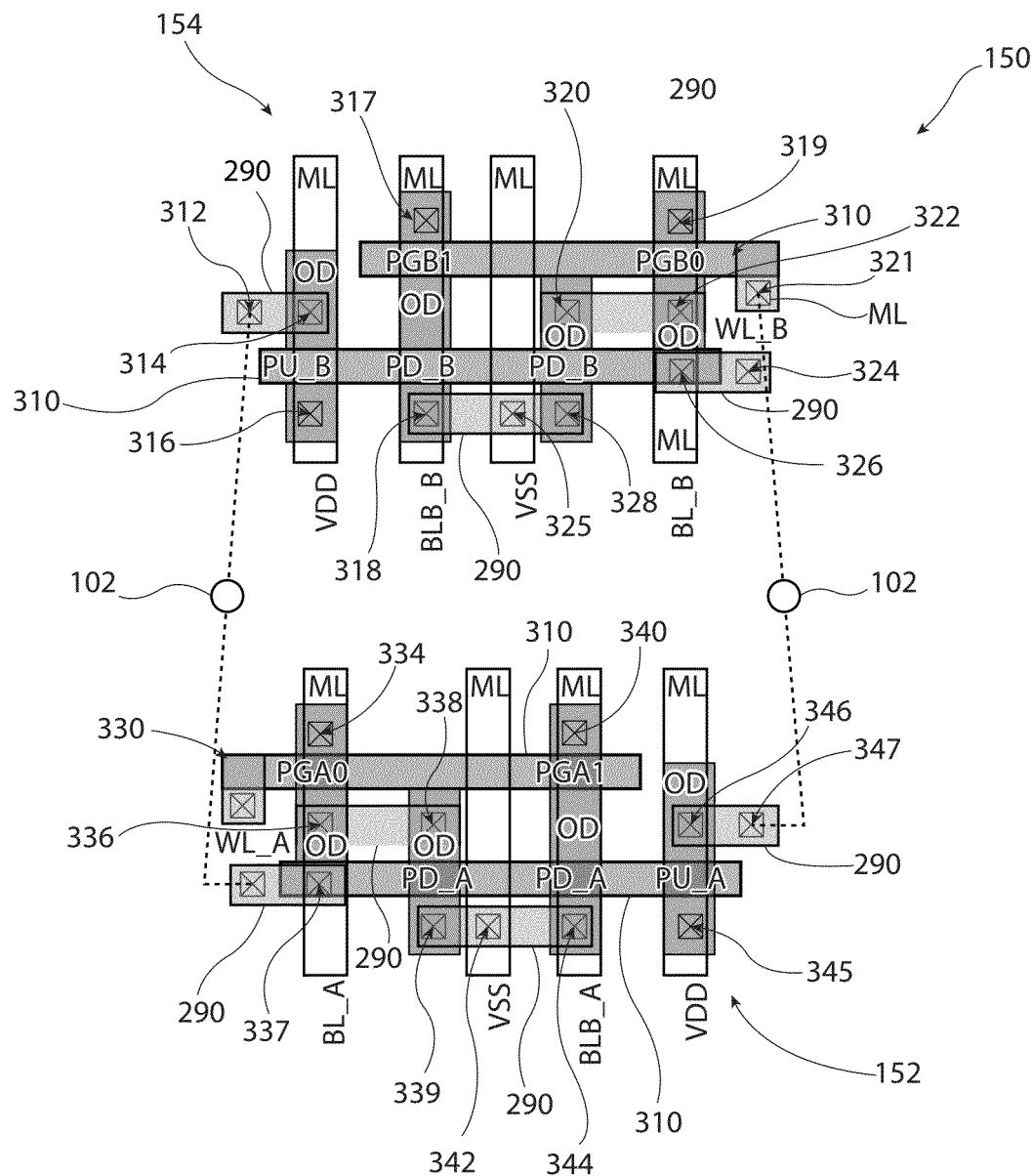
FIG. 4 is a block diagram of the three-dimensional dual-port bit cell shown in FIG. 3.

FIG. 3 is an electrical diagram of one example of dual-port bit cell 150 in accordance with some embodiments. FIG. 4 is a layout diagram of dual-port bit cell 150. Referring to FIG. 3, in some embodiments, dual-port bit cell 150 is a high density dual-port bit cell and, as discussed above, first portion 152 of cell 150 is disposed on a first layer of SRAM array 100 (FIG. 2), e.g., bottom layer 12-1 (shown in FIGS. 1 and 2). For example, first portion 152 is disposed on at least a portion of A-port array portion 106 (shown in FIG. 2). Therefore, first portion 152 includes the A-port elements. Second portion 154 of bit cell 150 is disposed on a second layer of SRAM array 100 (FIG. 2), e.g., upper layer 12-2 (shown in FIGS. 1 and 2), that is disposed vertically with respect to the first layer. For example, second portion 154 is disposed on at least a portion of B-array portion 116 (shown in FIG. 2) and, therefore, second portion 154 includes the B-port elements.

Referring to FIGS. 3 and 4, in some embodiments, each portion 152 and 154 includes a plurality of conductive lines or layers (e.g., M1, M2, M3, etc.) ("ML") having BLs and WLs disposed therein such that the BLs extend in a first direction in at least one conductive layer (e.g., M1, M2, M3) of each of the upper and lower layers or tiers 12-2 (shown in FIGS. 1 and 2) and 12-1 (shown in FIGS. 1 and 2), and the word lines WLs extend in a second direction in at least one second conductive layer (e.g., M1, M2, M3) of the upper and lower layers or tiers 12, wherein the first direction is different from the second direction. For example, first portion 152 includes at least one WL, such as WL_A that extends horizontally (i.e., in an x-direction) across bottom layer 12-1 (shown in FIGS. 1 and 2). First portion 152 also includes at least one pair of complementary BLs that extend vertically (i.e., in a y-direction) across bottom layer 12-1. For example, first portion 152 can include at least one pair of complementary BLs, such as BL_A and BLB_A also shown in FIGS. 3 and 4. As shown in FIG. 4, bit lines BL_A and BLB_A extend parallel to one another with a power line (e.g., VSS) disposed between them and extending parallel to bit lines BL_A and BLB_A. A second power line (e.g., VDD) is also disposed in the same conductive layer (e.g., M1, M2, M3) as bit lines BL_A and BLB_A and VSS. The line for VDD is disposed adjacent to BLB_A and extends parallel to bit lines BL_A and BLB_A and VSS. In some embodiments, first portion 152 also includes A-port elements that include at least two pass-gate (PG) transistor devices, such as PGA0 and PGA1, that are coupled to the WLs and to the BLs. In some embodiments, PG transistor devices are NMOS or PMOS devices. In some embodiments, additional interconnect structures 290 are used to connect the active devices of the first portion 152 and the active devices (e.g., transistors) in the second portion 154.

In some embodiments, first portion 152 also includes at least one inverter 302, wherein each inverter 302 can include at least one pull-up (PU) transistor device, such as PU_A (FIG. 4) and at least one pull-down (PD) transistor devices, such as PD_A (FIG. 4). In some embodiments, the PU transistor devices and the PD transistor devices are NMOS or PMOS devices. First portion 152 can have any number of PG, PU, and PD transistor devices.

Similar to first portion 152, second portion 154 also includes at least one WL, such as WL_B that extends horizontally (i.e., in an x-direction) across upper layer 12-2. Second portion 154 also includes at least one pair of complementary BLs that extend vertically (i.e., in a y-direction) across upper layer 12-2. For example, second portion 154 can include at least one pair of complementary BLs, such as BL_B and BLB_B. In some embodiments, second portion 154 also includes B-port elements that include at least two PG transistor devices, such as PGB0 and PGB1, that are coupled to the WLs and to the BLs. In some embodiments, PG transistor devices are NMOS or PMOS devices.

In some embodiments, second portion 154 also includes at least one inverter 304, wherein inverter 304 can include at least one PU transistor device, such as PUB and least one PD transistor devices, such as PD_B. In some embodiments, the PU transistor devices and the PD transistor devices are NMOS or PMOS devices. Second portion 154 can have any number of PG, PU, and PD transistor devices.

As shown in FIG. 4, each of the transistor devices, PGA0, PGA1, PD_A, PU_A, PGB0, PGB1, PD_B, and PU_B include gates 310 that may include may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof. In some embodiments, gates 310 can be formed over one or more active regions ("OD") of a semiconductor substrate using various technologies. For example, gates 310 can be formed as bulk planar metal oxide field effect transistors ("MOSFETs"), bulk finFETs having one or more fins or fingers, semiconductor on insulator ("SOI") planar MOSFETs, SOI finFETs having one or more fins or fingers, or combinations thereof.

In some embodiments, the PGA0, PGA1, PD_A, and PU_A transistor devices are disposed on bottom layer 12-1 such that the PGA0, PGA1, PD_A, and PU_A transistor devices are symmetric with the PGB0, PGB1, PD_B, and PU_B transistor devices, respectively. For example, in some embodiments, ports, such as A-port and B-port (shown in FIG. 2), are substantially parallel with respect to each other such that the PGA0 and PGA1 transistor devices are parallel with respect to the PD_A and PU_A transistor devices on the same layer 12-1. Similarly, the PGB0 and PGB1 transistor devices are parallel with respect to the PD_A and PU_A transistor devices on the same layer 12-2.

In some embodiments, various vias are used to facilitate connections within each layer 12-1 and 12-2 or between the layers 12-1 and 12-2. For example, as shown in FIG. 4, in some embodiments, one ILV 102 is used to connect a via 312 in layer 12-1 to a via 336 in layer 12-2. Similarly, the other ILV 102 is used to connect a via 324 in layer 12-1 to a via 347 in layer 12-2. Vias 314 and 316 connect the PU_B transistor device transistor PGA0 and to the power supply line VDD, respectively. Via 317 connects the PGB1 transistor device to the BLB_B. Vias 318, 325, and 328 connect the PD_B transistor devices to the power supply line VSS. Vias 320 and 322 and interconnect 290 connect the PGB0 transistor device to the PD_B transistor devices. Via 319 connects the PGB0 transistor device to the BL_B, and via 326 and interconnect 290 connect the PGB0 transistor device to via 324. Via 321 connects the PGB0 transistor device to the WL_B.

In some embodiments, via 330 connects the PGA0 transistor device to the WL_A. Via 334 connects the PGA0 transistor device to the BL_A. Via 337 and interconnect 290 connect the PD_A transistor device and PGA0 to the ILV 102. Vias 336 and 338 and interconnect 290 connect the PGA0 transistor device to the PD_A transistor devices. Vias 339, 342, and 344 and interconnect 290 connect the PD_A transistor devices to the power supply line VSS. Via 340 connects the PGA1 transistor device to BLB_A. Vias 346 and 347 and interconnect 290 connect the PU_A transistor device to ILV 290. Via 345 connects transistor PU_A to the power supply line VDD.

When using the described configurations for dual-port bit cell 150, one set of port elements, such as the A-port, are disposed on bottom layer 12-1 of SRAM array 100 and the other set of port elements, such as the B-port, are disposed on upper layer 12-2 of SRAM array 100. Such a design and configuration facilitates a cell footprint reduction and a total cell area reduction. Because the configurations for dual-port bit cell 150 have the two sets of port elements on separate layers, WL parasitic resistance and capacitance is reduced. As such, the overall performance of the dual-port bit cell 150 is substantially improved. Also, by having the two sets of port elements on separate layers, power routing and signal routing for each of the A-port and B-port is separated between the two layers. For example, in some embodiments, the power supply for the A-port can be routed within bottom layer 12-1 for the PU_A or the PD_A transistor devices and a first set of signals (WL_A, BL_A, and BLB_A) for the A-port can be routed within bottom layer 12-1 for the PGA0 and PGA1 transistor devices. Similarly, the power supply for the B-port can be routed within upper layer 12-2 for the PU_B or the PD_B transistor devices and a second set of signals (WL_B, BL_B, and BLB_B) for the A-port can be routed within upper layer 12-2 for the PGB0 and PGB1 transistor devices.

Figure 5:
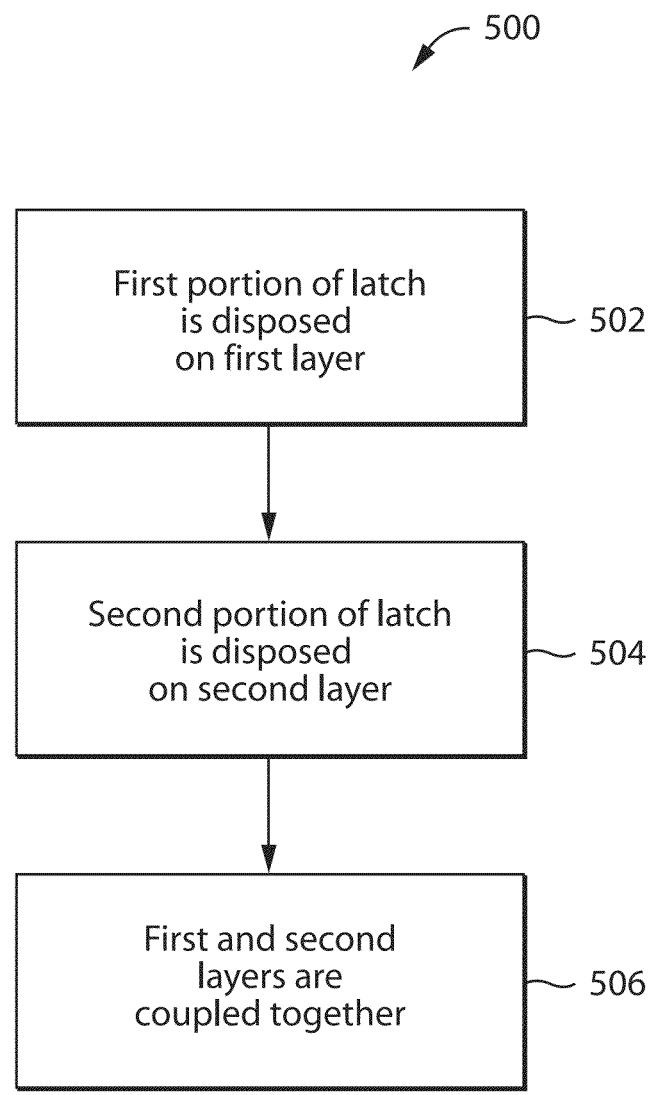
FIG. 5 is a flow diagram of one example of a method of assembling the three-dimensional dual-port bit cell shown in FIG. 3.

FIG. 5 is a flow diagram of one example of a method 500 of assembling a three dimensional dual-port bit cell, such as cell 150 (shown in FIGS. 2, 3, and 4), to be used with a semi-conductor memory or SRAM array, such as SRAM array 100 (shown in FIG. 2). At step 502, a first portion of a latch is disposed onto a first layer. For example, first portion 152 (shown in FIGS. 2, 3, and 4) is disposed on at least a portion of A-port array portion 106 (shown in FIG. 2) on bottom layer 12-1 (shown in FIGS. 1 and 2) of 3D IC 10 (shown in FIG. 1). In some embodiments, the active devices of the first portion 152 are formed in a semi-conductor substrate (not shown) using a semi-conductor processing technology. A-port WL decoder and driver portion 108 (shown in FIG. 2), A-port I/O circuit 110 (shown in FIG. 2), and A-port control circuit 112 (shown in FIG. 2) are also formed in and on bottom layer 12-1.

At step 504, a second portion of the latch is disposed onto a second layer that is adjacent to the first layer. For example, second portion 154 (shown in FIGS. 2, 3, and 4) is disposed on at least a portion of B-array portion 116 (shown in FIG. 2) on upper layer 12-2 (shown in FIGS. 1 and 2) 3D IC 10. B-port WL decoder and driver portion 118 (shown in FIG. 2), B-port I/O circuit 120 (shown in FIG. 2), and B-port control circuit 122 (shown in FIG. 2) are also formed in and on upper layer 12-2.

At step 506, the first and second layers are coupled together such that the second layer is vertically stacked with respect to the first layer using at least one via. For example, if layers 12-1 and 12-2 are separate semi-conductor chips, then layers 12-1 and 12-1 are vertically stacked on top of one another, aligned, and bonded together. In some embodiments, such as embodiments in which layers 12-1 and 12-2 are tiers, the layers are stacked on top of one another to create a 3D stacked complementary metal-oxide-semiconductor CMOS IC. One of ordinary skill in the art will understand that one or more layers can be disposed between layers 12-1 and 12-2 in some embodiments. In some embodiments, the circuitry formed in and/or on layer 12-1 is coupled to the circuitry formed in and/or on layer 12-2 using at least one via, such as ILV 102 (shown in FIGS. 2, 3, and 4). For example, in some embodiments, as shown in FIG. 4, one ILV 102 is used to connect via 312 in the layer 12-1 to via 336 in layer 12-2. Similarly, as shown in FIG. 4, the other ILV 102 is used to connect via 324 in layer 12-1 to via 347 in layer 12-2. Further, as shown in FIG. 4, various vias are used to facilitate connections within each layer 12-1 and 12-2.

Embodiments of the three dimensional dual-port bit cell described herein have a configuration and design that facilitates a reduction in footprint area while improving overall cell performance and inhibiting signal routing complexities for the corresponding static random access memory ("SRAM") array that the cell is used with. For example, in some embodiments, the 3D dual-port cell is configured such that one set of port elements of a portion of a latch are disposed on one layer of a 3D semi-conductor IC and another set of port elements of another portion of the latch are disposed on a different layer of the IC that is vertically adjacent to the other layer. Having the two different sets of port elements on separate layers of the IC facilitates a footprint area reduction, and WL parasitic resistance and capacitance is also reduced. Therefore, the overall performance of the cell is substantially improved.

In some embodiments, a three dimensional dual-port bit cell includes a first portion of a latch disposed on a first tier, wherein the first portion includes a plurality of first port elements. A second portion of the latch is disposed on a second tier that is vertically stacked with respect to the first tier using at least one via, wherein the second portion includes a plurality of second port elements.

In some embodiments, a semi-conductor memory includes a first tier that includes a first port array portion. The semi-conductor memory also includes a second tier that is vertically stacked with respect to the first tier using at least one via, wherein the second tier includes a second port array portion. The semi-conductor memory also includes at least one three dimensional dual-port bit cell that includes a first portion of a latch disposed on the first port array portion, wherein the first portion includes a plurality of first port elements. The dual-port bit cell also includes a second portion of the latch disposed on the second array portion, wherein the second portion includes a plurality of second port elements.

In some embodiments, a method of using a three dimensional dual-port bit cell includes disposing a first portion of a latch of the three-dimensional dual-port bit cell onto a first tier, wherein the first portion includes a plurality of first port elements. The method also includes disposing a second portion of the latch of the three-dimensional dual-port bit cell onto a second tier that is vertically stacked with respect to the first tier using at least one via, wherein the second portion includes a plurality of second port elements.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A three dimensional dual-port bit cell comprising:
    a latch comprising first and second cross-coupled inverters;
    a first portion of the latch disposed on a first tier, wherein said first portion comprises a plurality of first port elements and the first inverter;
    a second portion disposed on a second tier that is vertically stacked with respect to the first tier using at least one via, wherein said second portion comprises a plurality of second port elements of the latch and the second inverter.

2. The three-dimensional dual-port bit cell of claim 1, wherein said first portion further comprises a plurality of first bit lines that each extends in a first direction in a first conductive layer of the first tier and said second portion further comprises a plurality of second bit lines that each extends in the first direction in a first conductive layer of the second tier.

3. The three-dimensional dual-port bit cell of claim 2, wherein said first portion further comprises a first word line that extends in a second direction that is different from the first direction in a second conductive layer of the first tier and said second portion further comprises a second word line that extends in the second direction in a second conductive layer of the second tier.

4. The three-dimensional dual-port bit cell of claim 1, wherein each of said plurality of first and second port elements comprises at least one pass-gate device.

5. The three-dimensional dual-port bit cell of claim 4, wherein each of said at least one pass-gate device is one of a NMOS device or a PMOS device.

6. The three-dimensional dual-port bit cell of claim 1, wherein said plurality of first port elements are disposed on the first tier and said plurality of second port elements are disposed on the second tier such that each of said plurality of first port elements are symmetric with respect to each of said plurality of second port elements.

7. A semi-conductor memory comprising:
    a first tier comprising a first port array portion;
    a second tier vertically stacked with respect to said first tier using at least one via, wherein said second tier comprises a second port array portion; and
    at least one three dimensional dual-port bit cell comprising:
        a first portion of a latch disposed on said first port array portion, wherein said first portion comprises a plurality of first port elements;
        a second portion of the latch disposed on said second port array portion, wherein said second portion comprises a plurality of second port elements;
        a first control circuit associated with the first port elements disposed on said first tier and a second control circuit associated with the second port elements disposed on said second tier; and
        a first input/output (I/O) circuit for the first port elements disposed on said first tier and a second I/O circuit for the second port elements disposed on said second tier.

8. The semi-conductor memory of claim 7, wherein said first portion further comprises a plurality of first bit lines that each extends in a first direction in a first conductive layer of said first tier and said second portion further comprises a plurality of second bit lines that each extends in the first direction in a first conductive layer of said second tier.

9. The semi-conductor memory of claim 8, wherein said first portion further comprises a first word line that extends in a second direction that is different from the first direction in a second conductive layer of said first tier and said second portion further comprises a second word line that extends in the second direction in a second conductive layer of said second tier.

10. The semi-conductor memory of claim 7, wherein each of said plurality of first and second port elements comprises at least one pass-gate device.

11. The semi-conductor memory of claim 10, wherein each of said at least one pass-gate device is one of a NMOS device or a PMOS device.

12. The semi-conductor memory of claim 7, wherein said plurality of first port elements are disposed on said first tier and said plurality of second port elements are disposed on said second tier such that each of said plurality of first port elements are symmetric with respect to each of said plurality of second port elements.

13. The semi-conductor memory of claim 7, wherein said first control circuit is disposed on said first tier such that said first control circuit is symmetrical with respect to said second control circuit.

14. The semi-conductor memory of claim 7, wherein said first I/O circuit is disposed on said first tier such that said first I/O circuit is symmetrical with respect to said second I/O circuit.

15. The semi-conductor memory of claim 7, further comprising a first word line decoder disposed on said first tier and a second word line decoder disposed on said second tier.

16. The semi-conductor memory of claim 15, wherein said first word line decoder is disposed on said first tier such that said first word line decoder is symmetrical with respect to said second word line decoder.

17. A method comprising:
    disposing a first portion of a latch of a three-dimensional dual-port bit cell onto a first tier, wherein the first portion includes a plurality of first port elements;
    disposing a second portion of the latch of the three-dimensional dual-port bit cell onto a second tier, wherein the second portion includes a plurality of second port elements; and
    coupling the first tier to the second tier such that the second tier is vertically stacked with respect to the first tier using at least one via.

18. The method of claim 17, further comprising:
    routing a first set of signals within the first tier for the plurality of first port elements; and
    routing a second set of signals within the second tier for the plurality of second port elements.

* * * * *